US010553674B2

(12) United States Patent
Sato et al.

(10) Patent No.: US 10,553,674 B2
(45) Date of Patent: Feb. 4, 2020

(54) SUBSTRATE FOR SEMICONDUCTOR DEVICE, SEMICONDUCTOR DEVICE, AND METHOD FOR MANUFACTURING SEMICONDUCTOR DEVICE

(71) Applicants: SANKEN ELECTRIC CO., LTD., Niiza-shi, Saitama (JP); SHIN-ETSU HANDOTAI CO., LTD., Tokyo (JP)

(72) Inventors: Ken Sato, Miyoshi-machi (JP); Hiroshi Shikauchi, Niiza (JP); Hirokazu Goto, Minato-ku (JP); Masaru Shinomiya, Annaka (JP); Keitaro Tsuchiya, Takasaki (JP); Kazunori Hagimoto, Takasaki (JP)

(73) Assignees: SANKEN ELECTRIC CO., LTD., Saitama (JP); SHIN-ETSU HANDOTAI CO., LTD., Tokyo (JP)

( * ) Notice: Subject to any disclaimer, the term of this patent is extended or adjusted under 35 U.S.C. 154(b) by 94 days.

(21) Appl. No.: 15/741,065

(22) PCT Filed: Jun. 17, 2016

(86) PCT No.: PCT/JP2016/002915
§ 371 (c)(1),
(2) Date: Dec. 29, 2017

(87) PCT Pub. No.: WO2017/002317
PCT Pub. Date: Jan. 5, 2017

(65) Prior Publication Data
US 2018/0204908 A1 Jul. 19, 2018

(30) Foreign Application Priority Data
Jun. 29, 2015 (JP) .................................. 2015-129625

(51) Int. Cl.
*H01L 21/02* (2006.01)
*H01L 29/06* (2006.01)
(Continued)

(52) U.S. Cl.
CPC ...... *H01L 29/0638* (2013.01); *H01L 21/0251* (2013.01); *H01L 21/0254* (2013.01);
(Continued)

(58) Field of Classification Search
CPC .......... H01L 29/0638; H01L 21/02378; H01L 21/02381
See application file for complete search history.

(56) References Cited

U.S. PATENT DOCUMENTS

2010/0123169 A1   5/2010   Sato
2010/0244098 A1   9/2010   Yokoyama
(Continued)

FOREIGN PATENT DOCUMENTS

JP   2010-123725 A   6/2010
JP   2010-182872 A   8/2010
(Continued)

OTHER PUBLICATIONS

Dec. 11, 2018 Office Action issued in Japanese Patent Application No. 2015-129625.
(Continued)

*Primary Examiner* — Douglas M Menz
(74) *Attorney, Agent, or Firm* — Oliff PLC

(57) ABSTRACT

A substrate for semiconductor device includes a substrate, a buffer layer which is provided on the substrate and made of a nitride semiconductor, and a device active layer which is provided on the buffer layer and composed of a nitride semiconductor layer, wherein the buffer layer contains carbon and iron, a carbon concentration of an upper surface of the buffer layer is higher than a carbon concentration of a (Continued)

lower surface of the buffer layer, and an iron concentration of the upper surface of the buffer layer is lower than an iron concentration of the lower surface of the buffer layer. As a result, the substrate for semiconductor device can reduce a leak current in a lateral direction at the time of a high-temperature operation while suppressing a leak current in a longitudinal direction.

20 Claims, 13 Drawing Sheets

(51) Int. Cl.
  *H01L 29/778* (2006.01)
  *H01L 29/66* (2006.01)
  H01L 29/207 (2006.01)
  H01L 29/20 (2006.01)
(52) U.S. Cl.
  CPC .... *H01L 21/0262* (2013.01); *H01L 21/02378* (2013.01); *H01L 21/02381* (2013.01); *H01L 21/02458* (2013.01); *H01L 21/02507* (2013.01); *H01L 21/02579* (2013.01); *H01L 21/02581* (2013.01); *H01L 29/66462* (2013.01); *H01L 29/7786* (2013.01); *H01L 29/7787* (2013.01); H01L 29/2003 (2013.01); H01L 29/207 (2013.01)

(56) References Cited

U.S. PATENT DOCUMENTS

| | | |
|---|---|---|
| 2011/0241017 A1 | 10/2011 | Ikeda et al. |
| 2012/0025203 A1 | 2/2012 | Nakata et al. |
| 2013/0075786 A1 | 3/2013 | Ishiguro |
| 2014/0008661 A1 | 1/2014 | Iwami et al. |
| 2014/0091313 A1 | 4/2014 | Kotani et al. |
| 2014/0239308 A1 | 8/2014 | Hallin et al. |
| 2015/0060765 A1 | 3/2015 | Kotani et al. |

FOREIGN PATENT DOCUMENTS

| | | |
|---|---|---|
| JP | 2010-232297 A | 10/2010 |
| JP | 2010-258441 A | 11/2010 |
| JP | 2012-033646 A | 2/2012 |
| JP | 2013-074211 A | 4/2013 |
| JP | 2014-017285 A | 1/2014 |
| JP | 2014-072430 A | 4/2014 |
| JP | 2015-053328 A | 3/2015 |

OTHER PUBLICATIONS

Jan. 2, 2018 International Preliminary Report on Patentability issued in International Patent Application No. PCT/JP2016/002915.
Aug. 9, 2016 International Search Report issued in International Patent Application No. PCT/JP2016/002915.
Aug. 9, 2016 Written Opinion issued in International Patent Application No. PCT/JP2016/002915.
Jun. 5, 2018 Office Action issued in Japanese Patent Application No. 2015-129625.
Sep. 6, 2019 Office Action issued in Taiwanese Patent Application No. 105119761.

(a)

(b)

SUBSTRATE FOR SEMICONDUCTOR DEVICE, SEMICONDUCTOR DEVICE, AND METHOD FOR MANUFACTURING SEMICONDUCTOR DEVICE

TECHNICAL FIELD

The present invention relates to a substrate for semiconductor device, a semiconductor device, and a method for manufacturing a semiconductor device.

BACKGROUND ART

A substrate for semiconductor device using a nitride semiconductor is adopted in, e.g., a power device which operates at a high frequency with high output. In particular, as a device suitable for performing amplification in a high-frequency band of, e.g., micro waves, submillimeter waves, or millimeter waves, for example, a high electron mobility transistor (HEMT) is known.

Such a substrate for semiconductor device which is used as HEMT is disclosed in, e.g., Patent Document 1. In Patent Document 1, as shown in FIG. 13, a substrate for semiconductor device has a buffer layer 114 which is formed on a silicon substrate 111 and formed by alternately stacking first semiconductor layers 112 made of AlN and second semiconductor layers 113 which is made of GaN and doped with Fe, a channel layer 115 which is formed on the buffer layer 114 and made of GaN, and a barrier layer 116 which is formed on the channel layer 115 and made of AlGaN.

It is to be noted that providing a source electrode S, a drain electrode D, and a gate electrode G on the HEMT semiconductor substrate enables obtaining the HEMT.

In the substrate for semiconductor device disclosed in Patent Document 1, a breakdown voltage in a longitudinal direction is improved by doping Fe in the buffer layer 114 (see, e.g., FIG. 12). Here, FIG. 12 shows drain voltage dependence of a leak current in the longitudinal direction in each of a Fe doping example and a non-doping example.

However, in the Fe doping, it is known that precipitous control cannot be performed due to surface segregation or the like and hence Fe is mixed into an upper layer (i.e., the channel layer) (see Patent Document 2). It is known that, when this Fe enters the channel layer, a harmful influence, e.g., a reduction in mobility is exerted on forward characteristics, and adopting a structure and a manufacturing method which can prevent mixing into the channel layer is preferable.

A structure which prevents Fe used for an increase in resistance from being introduced into the upper channel layer is disclosed in, e.g., Patent Documents 2 to 4.

CITATION LIST

Patent Literatures

Patent Document 1: Japanese Unexamined Patent Publication (Kokai) No. 2010-123725

Patent Document 2: Japanese Unexamined Patent Publication (Kokai) No. 2013-074211

Patent Document 3: Japanese Unexamined Patent Publication (Kokai) No. 2010-232297

Patent Document 4: Japanese Unexamined Patent Publication (Kokai) No. 2010-182872

DISCLOSURE OF INVENTION

Problem to be Solved by the Invention

The present inventors have discovered that, in the HEMT structure having the electrodes provided on the substrate for semiconductor device including the Fe-doped buffer layer, when a predetermined voltage is applied between a source and a drain in an OFF state where the source electrode S is electrically connected with the silicon substrate 111, a leak in the longitudinal direction can be suppressed, but a leak in a lateral direction increases at the time of a high-temperature operation (see FIGS. 8 to 11). Here, FIG. 8 shows leak currents at the time of a room-temperature operation when the buffer layer is not doped with Fe, FIG. 9 shows leak currents at the time of a high-temperature operation when the buffer layer is not doped with Fe, FIG. 10 shows leak currents at the time of the room-temperature operation when the buffer layer is doped with Fe, FIG. 11 shows leak currents at the time of the high-temperature operation when the buffer layer is doped with Fe, and $I_D$ is a leak current flowing through the drain electrode, $I_G$ is a leak current flowing through the gate electrode, $I_S$ is a leak current (a lateral direction leak current) flowing through the source electrode, and $I_{SUB}$ is a leak current (a longitudinal direction leak current) flowing into the silicon substrate 111 throughout the drawings.

In view of the problems, it is an object of the present invention to provide a substrate for semiconductor device which has a high breakdown voltage in an actual operation by reducing a leak current in a lateral direction at the time of a high-temperature operation while suppressing a leak current in a longitudinal direction, a semiconductor device using the substrate for semiconductor, and a manufacturing method thereof.

Means for Solving Problem

To achieve the object, the present invention provides a substrate for semiconductor device including: a substrate; a buffer layer which is provided on the substrate and made of a nitride semiconductor; and a device active layer which is provided on the buffer layer and composed of a nitride semiconductor layer, wherein the buffer layer contains carbon and iron, a carbon concentration of an upper surface of the buffer layer is higher than a carbon concentration of a lower surface of the buffer layer, and an iron concentration of the upper surface of the buffer layer is lower than an iron concentration of the lower surface of the buffer layer.

As described above, when the carbon concentration of the upper surface of the buffer layer is set to be higher than the carbon concentration of the lower surface of the buffer layer and the iron concentration of the upper surface of the buffer layer is set to be lower than the iron concentration of the lower surface of the buffer layer, the iron concentration on the upper surface side of the buffer layer which is a cause of a leak in the lateral direction at the time of a high-temperature operation can be decreased while suppressing a leak current in the longitudinal direction at the time of a room-temperature operation and the high-temperature operation, and hence the leak current in the lateral direction at the time of the high-temperature operation can be lowered while suppressing the leak current in the longitudinal direction.

At this time, it is preferable that a sum of the carbon concentration and the iron concentration of the upper surface of the buffer layer is not lower than a sum of the carbon concentration and the iron concentration of the lower surface of the buffer layer.

With this concentration distribution, the leak current in the lateral direction at the time of the high-temperature operation can be more surely suppressed while suppressing the leak current in the longitudinal direction at the time of the room-temperature operation and the high-temperature operation.

At this time, it is preferable that the buffer layer is a stacked body of AlGaN layers having different compositions or a stacked body of an AlN layer and a GaN layer.

The stacked body can be preferably used as the buffer layer.

At this time, a high-resistance layer may be further provided between the buffer layer and the device active layer, and a carbon concentration of the high-resistance layer may be not lower than the carbon concentration of the buffer layer.

When the high-resistance layer having the above-described carbon concentration distribution is provided, the leak currents in the longitudinal direction and the lateral direction can be surely suppressed.

At this time, it is preferable that the high-resistance layer is made of GaN having a thickness of 500 nm or more.

As the high-resistance layer, GaN having the thickness of 500 nm or more can be preferably used.

It is preferable that the buffer layer is a stacked body of an AlN layer and a GaN layer and each layer of the stacked body has a thickness of 0.5 nm or more and 300 nm or less.

The above-described stacked body can be preferably used as the buffer layer.

Further, the present invention also provides a substrate for semiconductor device including: a substrate; a buffer layer which is provided on the substrate and made of a nitride semiconductor; and a device active layer which is provided on the buffer layer and made of a nitride semiconductor layer, wherein the buffer layer includes a region where a carbon concentration increases and an iron concentration decreases from the substrate side toward the device active layer side, the carbon concentration of an upper surface of the buffer layer is higher than the carbon concentration of a lower surface of the buffer layer, and the iron concentration of the upper surface of the buffer layer is lower than the iron concentration of the lower surface of the buffer layer.

As described above, when the buffer layer includes the region where the carbon concentration increases and the iron concentration decreases from the substrate side toward the device active layer side and the carbon concentration of the upper surface of the buffer layer is set to be higher than the carbon concentration of the lower surface of the buffer layer while the iron concentration of the upper surface of the buffer layer is set to be lower than the iron concentration of the lower surface of the buffer layer, the iron concentration on the upper surface side of the buffer layer which is a cause of the leak in the lateral direction at the time of the high-temperature operation can be reduced while suppressing the leak current in the longitudinal direction at the time of the room-temperature operation and the high-temperature operation, and hence the leak current in the lateral direction at the time of the high-temperature operation can be reduced while suppressing the leak current in the longitudinal direction.

Furthermore, the present invention provides a semiconductor device including the substrate for semiconductor device, wherein the device active layer includes: a channel layer made of a nitride semiconductor; and a barrier layer made of a nitride semiconductor having a different band gap from that of the channel layer, and the semiconductor device further includes an electrode which is electrically connected with a two-dimensional electron gas layer formed near an interface between the channel layer and the barrier layer.

According to such a semiconductor device, it is possible to provide the semiconductor device with a high breakdown voltage in which the leak current in the lateral direction is reduced at the time of the high-temperature operation while suppressing the leak current in the longitudinal direction.

Moreover, the present invention provides a method for manufacturing a semiconductor device, including: forming a buffer layer made of a nitride semiconductor on a substrate; forming a device active layer on the buffer layer; and forming an electrode on the device active layer, wherein the buffer layer contains carbon and iron, and is formed in such a manner that a carbon concentration of an upper surface of the buffer layer becomes higher than a carbon concentration of a lower surface of the buffer layer and an iron concentration of the upper surface of the buffer layer becomes lower than an iron concentration of the lower surface of the buffer layer.

When such a method for manufacturing a semiconductor device is used, it is possible to manufacture the semiconductor device which can reduce the leak current in the lateral direction at the time of the high-temperature operation while suppressing the leak current in the longitudinal direction.

At this time, it is preferable to form, as the buffer layer, a stacked body of AlGaN layers having different compositions or a stacked body of an AlN layer and a GaN layer.

The above-described stacked body can be preferably formed as the buffer layer.

Effect of the Invention

As described above, according to the inventive substrate for semiconductor device, the iron concentration of the upper surface of the buffer layer, which is a cause of the leak, is reduced while setting the carbon concentration in the upper surface of the buffer to be higher layer than that in the lower surface of the buffer layer, whereby the leak current in the lateral direction at the time of the high-temperature operation can be reduced while suppressing the leak current in the longitudinal direction. Further, according to the inventive semiconductor device, it is possible to provide the semiconductor device which can reduce the leak current in the lateral direction at the time of the high-temperature operation while suppressing the leak current in the longitudinal direction. Furthermore, when the inventive method for manufacturing a semiconductor device is used, it is possible to manufacture the semiconductor device which can reduce the leak current in the lateral direction at the time of the high-temperature operation while suppressing the leak current in the longitudinal direction.

BEST MODE(S) FOR CARRYING OUT THE INVENTION

Figure 1:
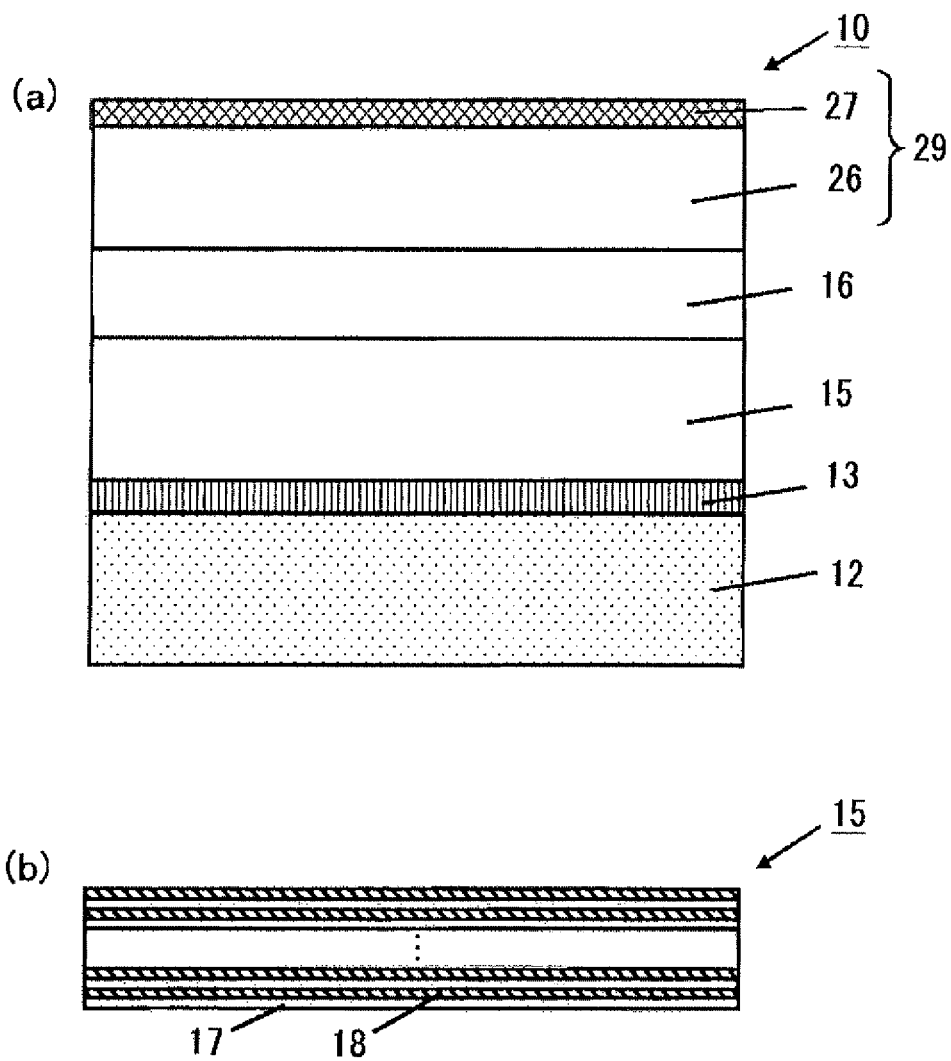
FIG. 1 is cross-sectional views showing an example of an embodiment of an inventive substrate for semiconductor device.

As described above, the present inventors have discovered that, in an Fe-doped buffer layer structure, a leak current in a longitudinal direction can be suppressed, but a leak current in a lateral direction increases at the time of a high-temperature operation.

Thus, the present inventors have keenly studied a substrate for semiconductor device which can reduce the leak current in the lateral direction at the time of the high-temperature operation while suppressing the leak current in the longitudinal direction at the time of a room-temperature operation. As a result, the present inventors have found out that increasing a concentration of carbon rather than that of iron is preferable for the leak current in the lateral direction at the time of the high-temperature operation, and that when the carbon concentration of the upper surface of the buffer layer is set to be higher than the carbon concentration of the lower surface of the buffer layer, and the iron concentration of the upper surface of the buffer layer is set to be lower than the iron concentration of the lower surface of the buffer layer considering that a leak current suppressing effect in the longitudinal direction of iron is higher that of carbon at the time of both the room-temperature operation and the high-temperature operation, the leak current in the lateral direction at the time of the high-temperature operation can be reduced by decreasing the iron concentration on the upper surface side of the buffer layer (e.g., near an interface between the buffer layer and a high-resistance layer) which is a cause of a leak in the lateral direction at the time of the high-temperature operation, while suppressing an increase in leak current in the longitudinal direction at the time of the room-temperature operation or the high-temperature operation, thereby bringing the present invention to completion.

An example of an embodiment of the present invention will now be described hereinafter in detail with reference to the drawings, but the present invention is not restricted thereto.

An example of an embodiment of an inventive substrate for semiconductor device will first be described with reference to FIG. 1.

A substrate for semiconductor device 10 shown in FIG. 1(a) has a substrate (e.g., a silicon-based substrate) 12, a buffer layer 15 made of a nitride semiconductor provided on the silicon-based substrate 12, and a device active layer 29 made of a nitride semiconductor provided on the buffer layer 15. The device active layer 29 is constituted of, e.g., a channel layer 26 and a barrier layer 27 having a band gap different from that of the channel layer 26.

Here, the silicon-based substrate 12 is a substrate made of, e.g., Si or SiC.

An initial layer 13 made of AlN may be provided between the silicon-based substrate 12 and the buffer layer 15.

As shown in FIG. 1(b), the buffer layer 15 can be formed by alternately stacking first layers 17 and second layers 18 having a lattice constant different from that of the first layers 17, and the respective layers may have different thicknesses.

The buffer layer 15 contains carbon and iron as impurities, and a carbon concentration of an upper surface of the buffer layer 15 is higher than that of a lower surface of the buffer layer 15, and an iron concentration of the upper surface of the buffer layer 15 is lower than that of the lower surface of the buffer layer 15. Further, in the buffer layer 15, a region where the carbon concentration increases and the iron concentration decreases from the substrate 12 side toward the device active layer 29 is provided.

When the buffer layer 15 has such an impurity concentration distribution as described above, the iron concentration near the upper surface of the buffer layer which is a cause of a leak in a lateral direction at the time of a high-temperature operation can be reduced while maintaining high resistance of the buffer layer 15, and hence a leak current in the lateral direction at the time of the high-temperature operation can be reduced while suppressing the leak current in the longitudinal direction.

It is to be noted that the iron concentration of the lower surface of the buffer layer 15 can be set to $1\times10^{18}$ atoms/cm$^3$ or more.

The first layers 17 are, e.g., Al$_x$Ga$_{1-x}$N layers, and the second layers 18 are, e.g., Al$_y$Ga$_{1-y}$N layers (x>y). Here, the first layers 17 can be AlN layers (i.e., x=1), and the second layers 18 can be GaN layers (i.e., y=0). Furthermore, the thickness of each of the layers 17 and 18 can be set to 0.5 nm or more and 300 nm or less.

As layers having lattice constants different from each other, such layers as described above can be preferably used.

The channel layer 26 is, e.g., a GaN layer, and the barrier layer 27 has a band gap different from that of the channel layer 26 and is, e.g., an AlGaN layer.

Here, the substrate for semiconductor device 10 can further include a high-resistance layer 16 between the buffer layer 15 and the device active layer 29, and the high-resistance layer 16 is, e.g., a GaN layer having a thickness of 500 nm or more, more preferably 1 μm or more which is larger than a thickness of each layer in the buffer layer 15. As the high-resistance layer, GaN having the above-described thickness can be preferably used. A maximum value of the carbon concentration of the high-resistance layer 16 may be set equal to or higher than a maximum value of the carbon concentration of the buffer layer 15.

When the high-resistance layer having such a carbon concentration distribution is provided, the leak current in the longitudinal direction can be assuredly suppressed.

Here, it is preferable that a sum of the carbon concentration and the iron concentration of the upper surface of the buffer layer 15 is not lower than a sum of the carbon concentration and the iron concentration of the lower surface.

When the buffer layer 15 has the above-described impurity concentration distribution, the leak current in the lateral direction at the time of the high-temperature operation can be more surely suppressed while suppressing the leak current in the longitudinal direction of the buffer layer 15.

An example of an embodiment of an inventive semiconductor device will now be described with reference to FIG. 2.

A semiconductor device 11 shown in FIG. 2(a) has a source electrode 30, a drain electrode 31, and a gate electrode 32 provided on the substrate for semiconductor device 10 which has been described above with reference to FIG. 1. The semiconductor device 11 is, e.g., a high electron mobility transistor (HEMT).

The source electrode 30 and the drain electrode 31 are arranged in such a manner that a current flows from the source electrode 30 to the drain electrode 31 through a two-dimensional electron gas layer 28 formed in the channel layer 26. The current flowing between the source electrode 30 and the drain 31 can be controlled by an electric potential which is applied to the gate electrode 32.

The semiconductor device having such a structure can be a semiconductor device which can reduce a leak current in the lateral direction at the time of the high-temperature operation while suppressing the leak current in the longitudinal direction. Additionally, the semiconductor device having such a structure can improve a current collapse phenomenon.

Figure 3:
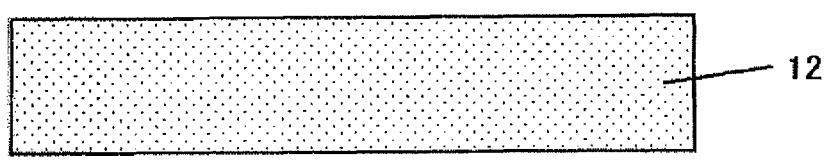
FIG. 3 is process cross-sectional views showing an example of an embodiment of an inventive method for manufacturing a semiconductor device.
Figure 3:
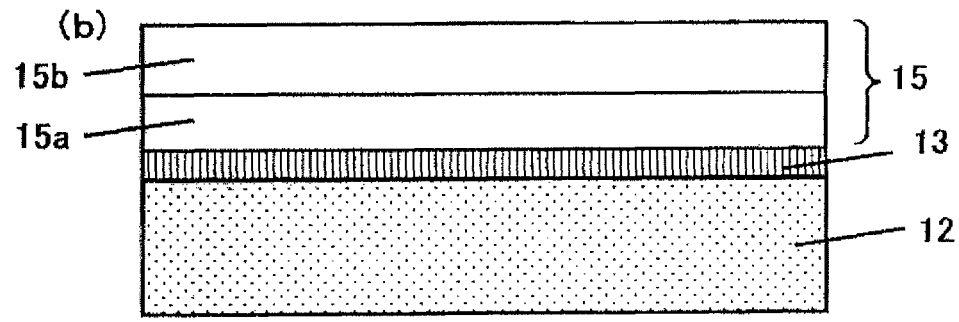
Figure 3:
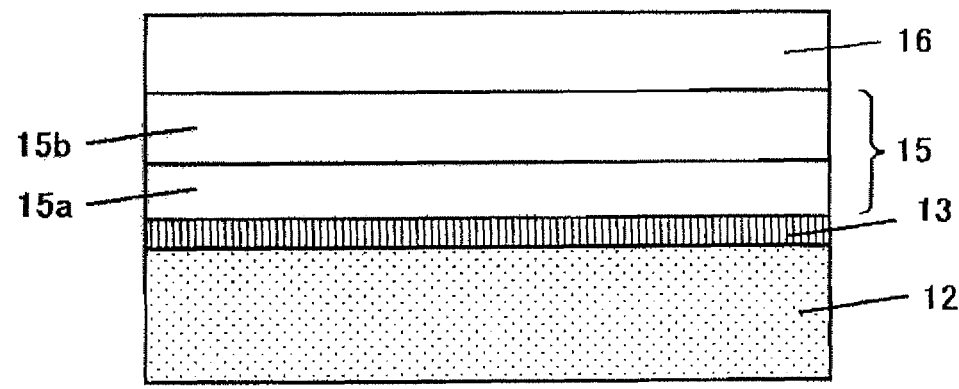
Figure 4:
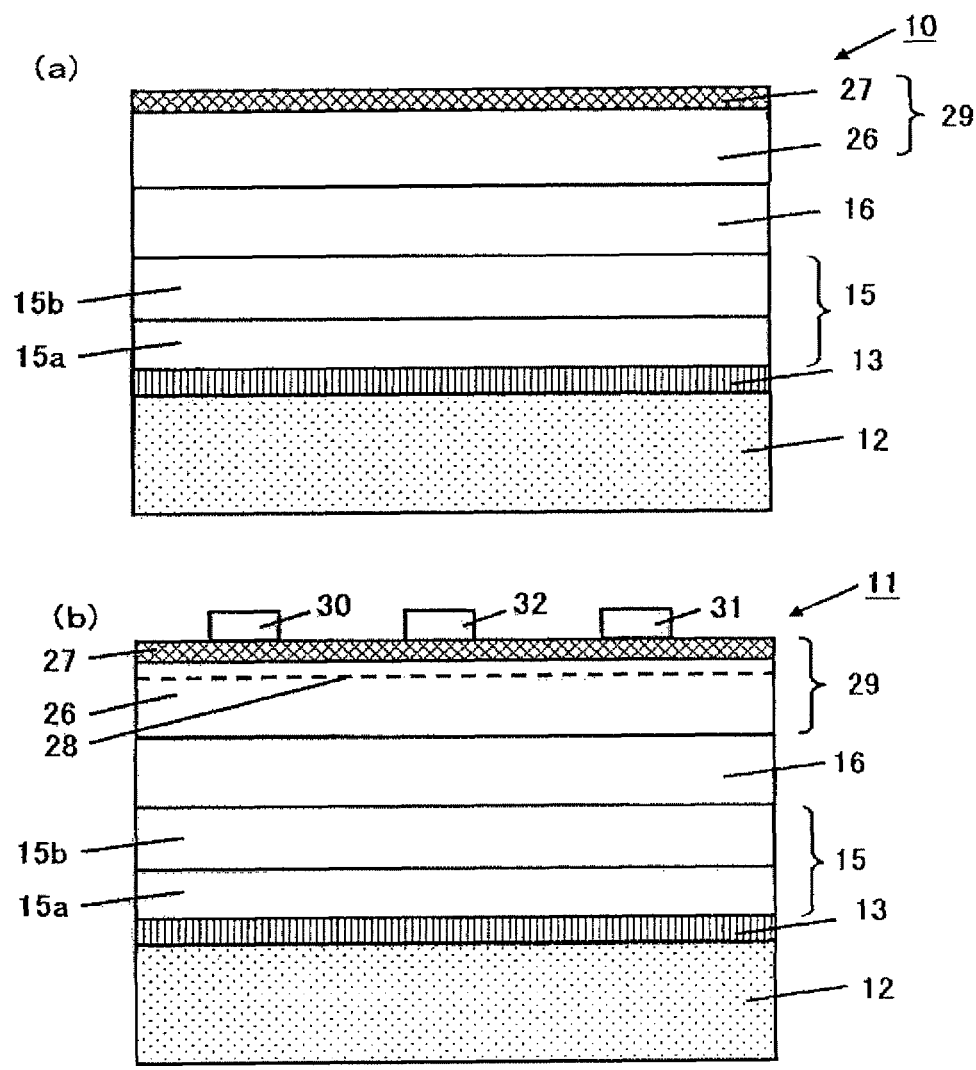
FIG. 4 is process cross-sectional views (continued from FIG. 3) showing the example of the embodiment of the inventive method for manufacturing a semiconductor device.

An example of an embodiment of an inventive method for manufacturing a semiconductor device will now be described with reference to FIGS. 3 and 4.

First, the silicon-based substrate (a substrate) 12 is prepared (see FIG. 3(a)).

Specifically, as the silicon-based substrate 12, a silicon substrate or an SiC substrate is prepared. The silicon substrate or the SiC substrate is generally used as a growth substrate for a nitride semiconductor layer.

Then, a lower buffer layer 15a formed of a nitride semiconductor layer containing iron and carbon and an upper buffer layer 15b formed of a nitride semiconductor layer which has a lower iron concentration than that of the lower buffer layer 15a or does not contain the iron, and which has a higher carbon concentration than that of the lower buffer layer 15a are formed on the silicon-based substrate 12 in the mentioned order by epitaxial growth (see FIG. 3(b)). An upper surface of the upper buffer layer 15b is formed in such a manner that a doping amount of the iron is set to be lower than that of a lower surface of the lower buffer layer 15a and a doping amount of the carbon is set to be higher than that of a lower surface of the lower buffer layer 15a. Here, the lower buffer layer 15a and the upper buffer layer 15b constitute the buffer layer 15.

It is to be noted that the iron concentration of the lower surface of the buffer layer 15 can be set to $1 \times 10^{18}$ atoms/cm$^3$ or more. Further, the carbon concentration of the lower surface of the buffer layer 15 can be set to $1 \times 10^{17}$ atoms/cm$^3$ or more.

As the lower buffer layer 15a and the upper buffer layer 15b, a stacked body of AlGaN layers having different compositions or a stacked body of an AlN layer and a GaN layer can be formed.

As the lower buffer layer 15a and the upper buffer layer 15b, the above-described stacked body can be preferably formed.

It is to be noted that, before forming the lower buffer layer 15a, the AlN initial layer 13 may be formed.

Then, on the buffer layer 15, the high-resistance layer 16 made of a nitride semiconductor which has an iron concentration lower than that of the lower surface of the lower buffer layer 15a or does not contain the iron, and which has a carbon concentration equal to or higher than that of the upper surface of the upper buffer layer 15b can be formed by the epitaxial growth (see FIG. 3(c)).

It is to be noted that control over the concentration of Fe can be performed by flow volume control of Cp$_2$Fe (biscyclopentadienyl iron) in addition to an auto-dope effect based on segregation.

Furthermore, although addition of the carbon is performed by taking the carbon contained in a source gas (TMG (trimethylgallium) or the like) into a film when a nitride-based semiconductor layer is grown by an MOVPE (metal organic vapor phase epitaxy) method, it can be also performed by using a doping gas such as propane.

Then, the device active layer 29 made of a nitride semiconductor is formed on the high-resistance layer 16 by the epitaxial growth (see FIG. 4(a)).

Specifically, the channel layer 26 made of GaN and the barrier layer 27 made of AlGaN are formed on the high-resistance layer 16 in the mentioned order by the MOVPE method. A film thickness of the channel layer 26 is, e.g., 500 to 4000 nm, and a film thickness of the barrier layer 27 is, e.g., 10 to 50 nm.

In this manner, the substrate for semiconductor device 10 shown in FIG. 1 is obtained.

Then, the electrodes are formed on the device active layer 29 (see FIG. 4(b)).

Specifically, the source electrode 30, the drain electrode 31, and the gate electrode 32 are formed on the barrier layer 27 of the substrate for semiconductor device 10. The source electrode 30 and the drain electrode 31 are formed in such a manner that a current flows from the source electrode 30 to the drain electrode 31 through the two-dimensional electron gas layer 28 formed in the channel layer 26.

Each of the source electrode 30 and the drain electrode 31 can be formed of, e.g., a Ti/Al stacked layer film, and the gate electrode 32 can be formed of a stacked layer film of a lower film constituted of an insulator film of SiO, SiN, or the like and an upper film made of a metal such as Ni, Au, Mo, or Pt.

Figure 2:
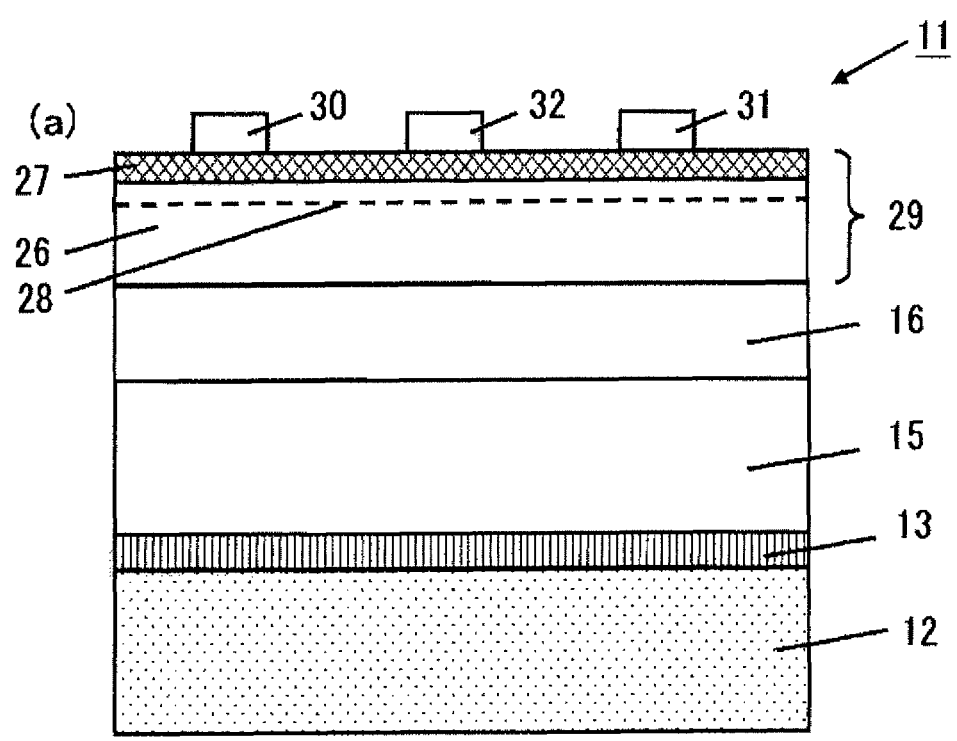
FIG. 2 is cross-sectional views showing an example of an embodiment of an inventive semiconductor device.
Figure 2:
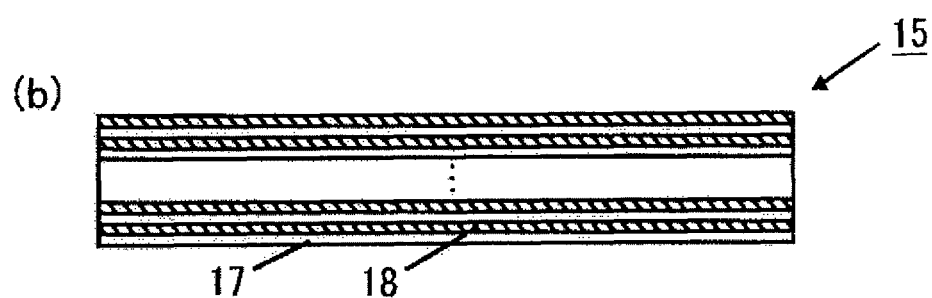

In this manner, the semiconductor device 11 in FIG. 2 can be manufactured.

When such a method for manufacturing a semiconductor device is used, it is possible to manufacture the semiconductor device which can reduce the leak current in the lateral direction at the time of the high-temperature operation while suppressing the leak current in the longitudinal direction and has a high breakdown voltage in an actual operation.

EXAMPLES

Although the present invention will now be more specifically described hereinafter with reference to an Example and Comparative Examples, the present invention is not restricted thereto.

Example

Figure 5:
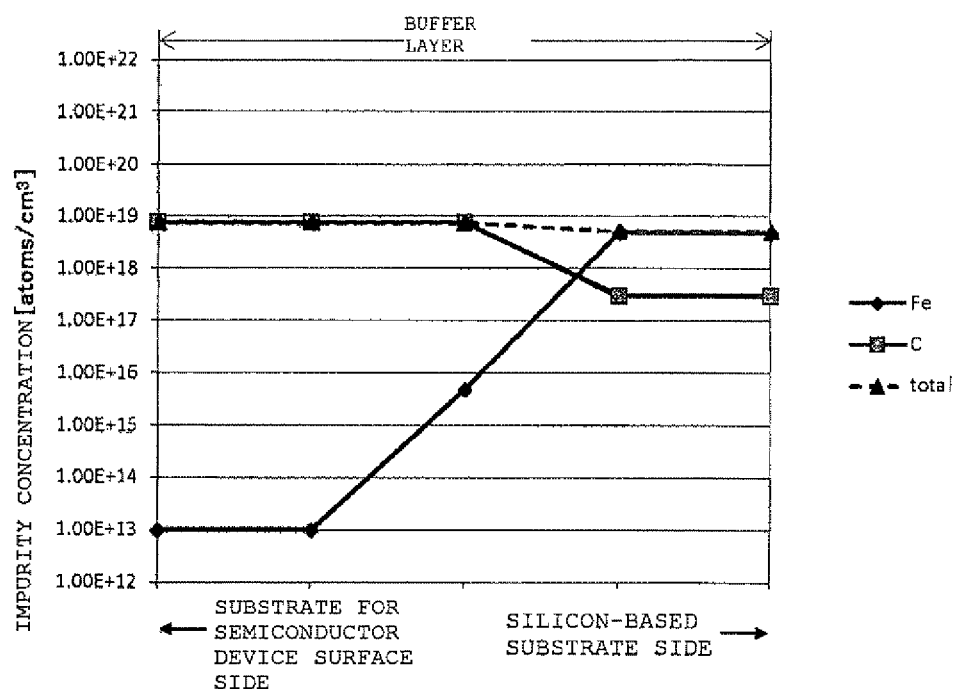
FIG. 5 is a view showing an impurity profile in a depth direction of the substrate for semiconductor device according to Example.

The substrate for semiconductor device 10 in FIG. 1 was manufactured by the manufacturing method described with reference to FIGS. 3(a) to (c) and FIG. 4(a). An impurity profile in the buffer layer of the manufactured substrate for semiconductor device 10 in a depth direction was measured by SIMS analysis. FIG. 5 shows this result. In FIG. 5, a carbon concentration of the upper surface of the buffer layer is higher than a carbon concentration of the lower surface of the buffer layer, an iron concentration of the upper surface of the buffer layer is lower than an iron concentration of the lower surface of the buffer layer, and a sum of the carbon concentration and the iron concentration of the upper surface of the buffer layer is not lower than a sum of the carbon concentration and the iron concentration of the lower surface of the buffer layer.

Then, the semiconductor device 11 in FIG. 2 was fabricated by the manufacturing method described with reference to FIG. 4(b) using the manufactured substrate for semiconductor device 10.

Figure 6:
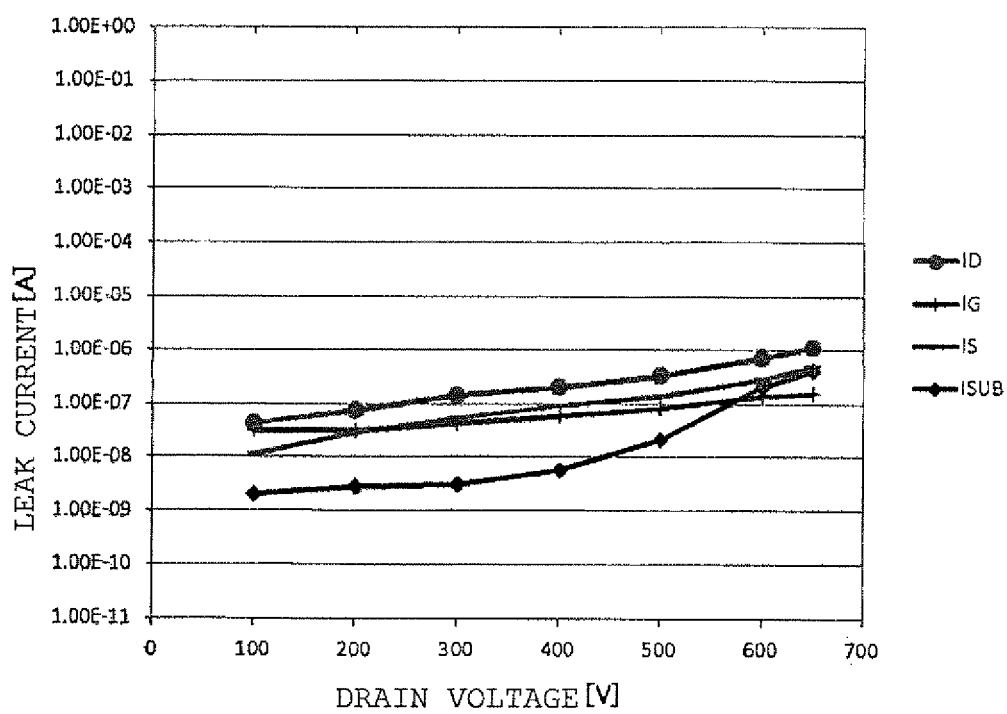
FIG. 6 is a view showing leak current characteristics of the semiconductor device according to Example at the time of a high-temperature operation.

In a case where the source electrode 30 was electrically connected with the silicon-based substrate 12 in the fabricated semiconductor device 11, leak current characteristics at 150° C. (i.e., at the time of a high-temperature operation) were measured. FIG. 6 shows this result. In FIG. 6, $I_D$ is a leak current flowing through the drain electrode, $I_S$ is a leak current flowing through the source electrode (a lateral direction leak current), $I_G$ is a leak current flowing through the gate electrode, and $I_{SUB}$ is a leak current flowing through the silicon-based substrate 12 (a longitudinal direction leak current).

Figure 7:
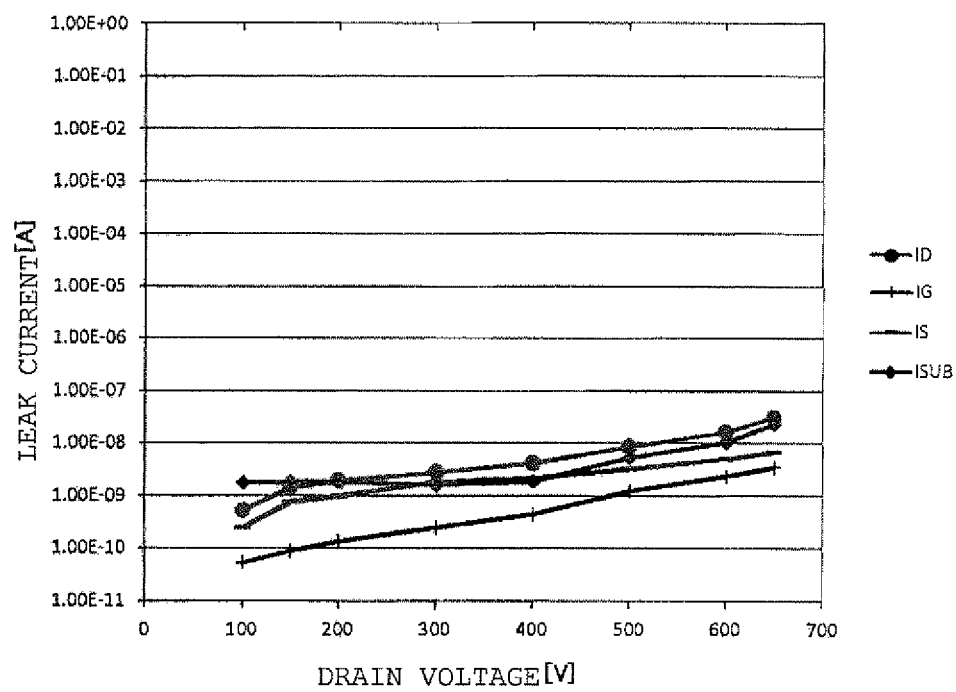
FIG. 7 is a view showing leak current characteristics of the semiconductor device according to Example at the time of a room-temperature operation.

Further, in the case where the source electrode 30 was electrically connected with the silicon-based substrate 12 in the fabricated semiconductor device 11, the leak current characteristics at the time of a room-temperature operation were measured. FIG. 7 shows this result. In FIG. 7, $I_D$ is a current flowing through the drain electrode, $I_S$ is a leak current flowing through the source electrode (the lateral direction leak current), $I_G$ is a leak current flowing through the gate electrode, and $I_{SUB}$ is a leak current flowing through the silicon-based substrate 12 (the longitudinal direction leak current).

Comparative Example 1

The substrate for semiconductor device in FIG. 1 was manufactured in the same manner as in Example. However, the buffer layer was not doped with iron.

The semiconductor device in FIG. 2 was fabricated by using the manufactured substrate for semiconductor device in the same manner as in Example.

Figure 8:
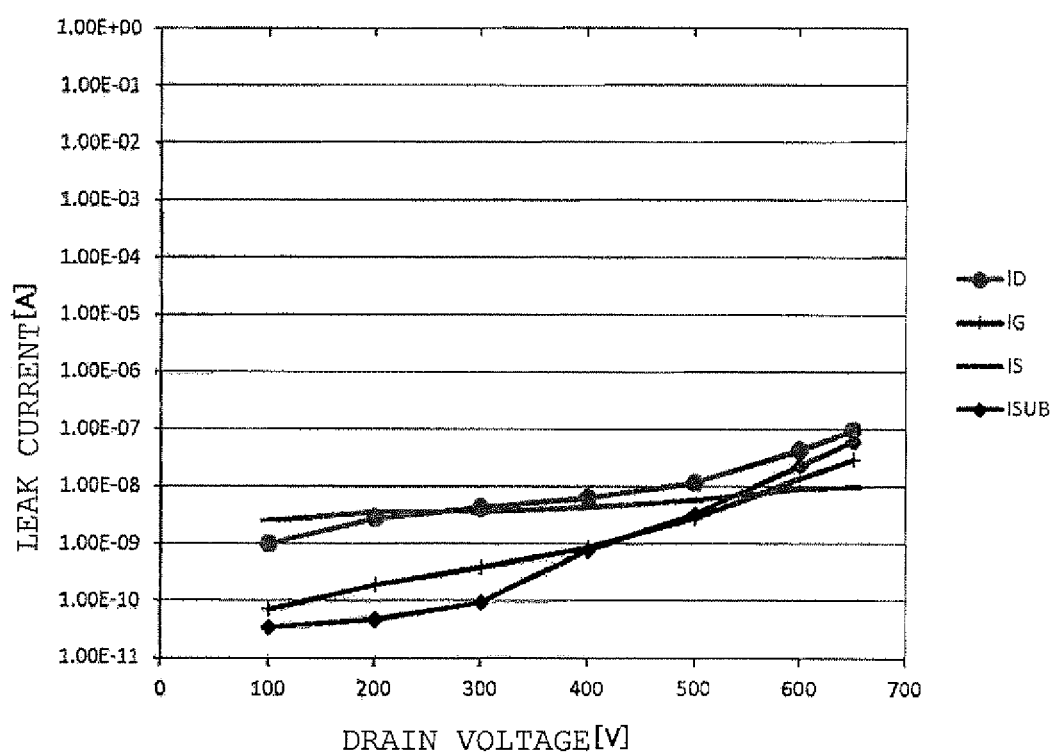
FIG. 8 is a view showing leak current characteristics of a semiconductor device according to Comparative Example 1 at the time of the room-temperature operation.

In the case where the source electrode was electrically connected with the silicon-based substrate in the fabricated semiconductor device, the leak current characteristics at the time of the room-temperature operation were measured. FIG. 8 shows this result. In FIG. 8, $I_D$ is a leak current flowing through the drain electrode, $I_S$ is a leak current flowing through the source electrode (the lateral direction leak current), $I_G$ is a leak current flowing through the gate electrode, and $I_{SUB}$ is a leak current flowing through the silicon-based substrate (the longitudinal direction leak current).

Figure 9:
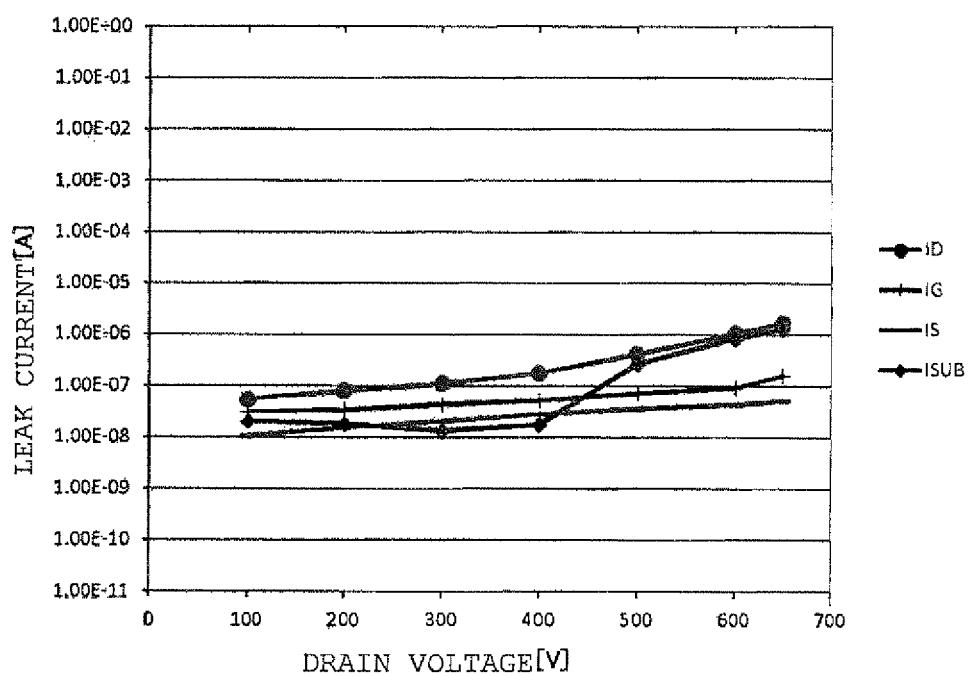
FIG. 9 is a view showing leak current characteristics of the semiconductor device according to Comparative Example 1 at the time of the high-temperature operation.

Furthermore, the leak current characteristics of the fabricated semiconductor device at 150° C. (i.e., at the time of the high-temperature operation) were measured in the same manner as in FIG. 8. FIG. 9 shows this result.

Comparative Example 2

The substrate for semiconductor device in FIG. 1 was manufactured in the same manner as in Example. However, a concentration of iron in the buffer layer was fixed (i.e., fixed at $5 \times 10^{18}$ atoms/cm$^3$).

The semiconductor device in FIG. 2 was fabricated by using the manufactured substrate for semiconductor device in the same manner as in Example.

Figure 10:
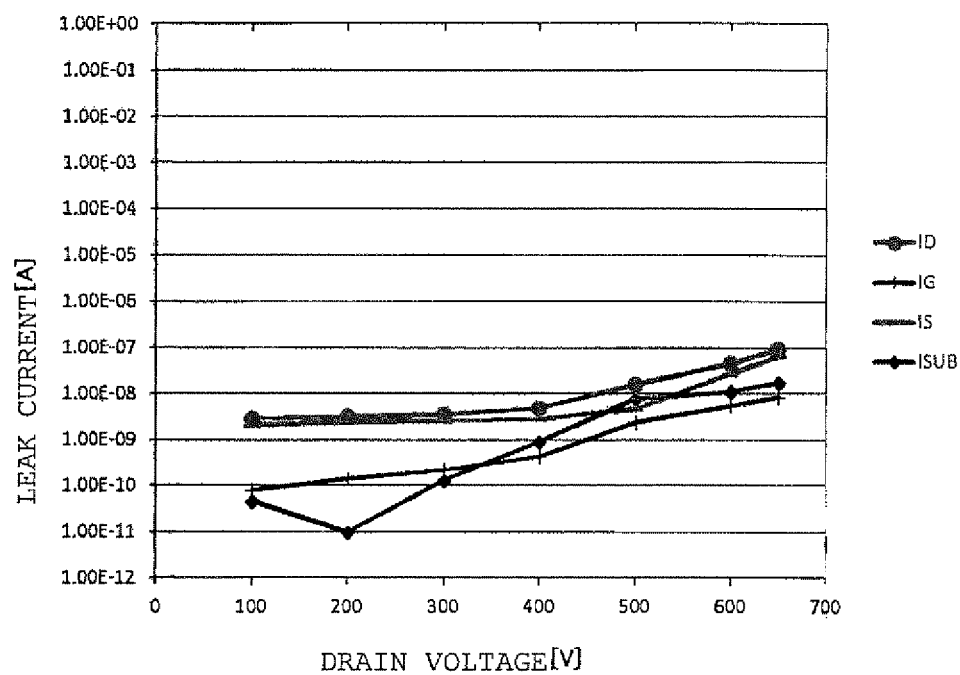
FIG. 10 is a view showing leak current characteristics of a semiconductor device according to Comparative Example 2 at the time of the room-temperature operation.

The leak current characteristics of the fabricated semiconductor device at the time of the room-temperature operation were measured in the same manner as in FIG. 8. FIG. 10 shows this result.

Figure 11:
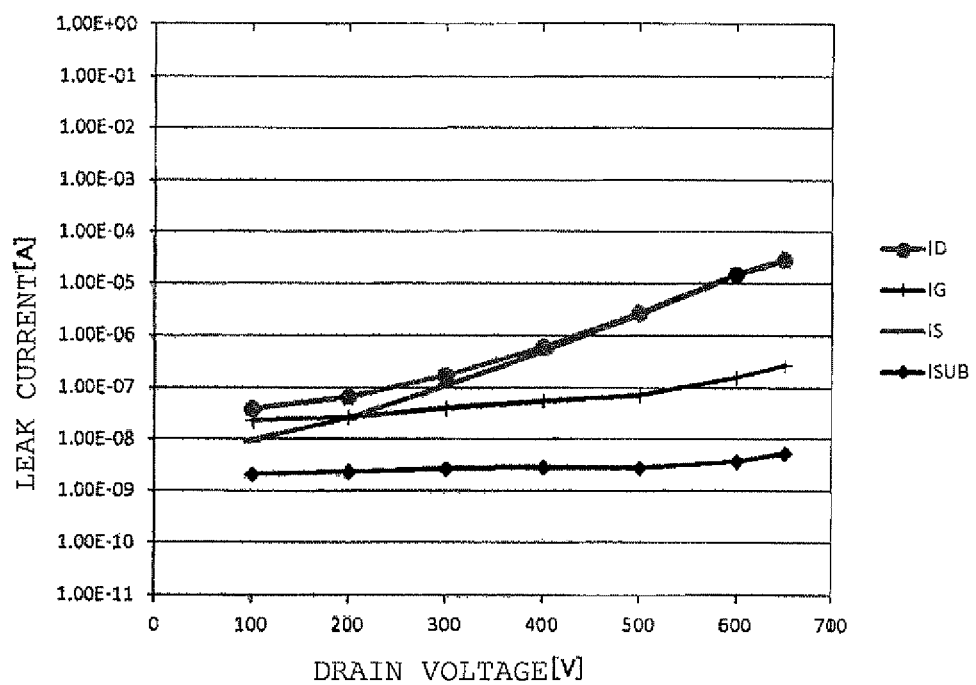
FIG. 11 is a view showing leak current characteristics of the semiconductor device according to Comparative Example 2 at the time of the high-temperature operation.
Figure 12:
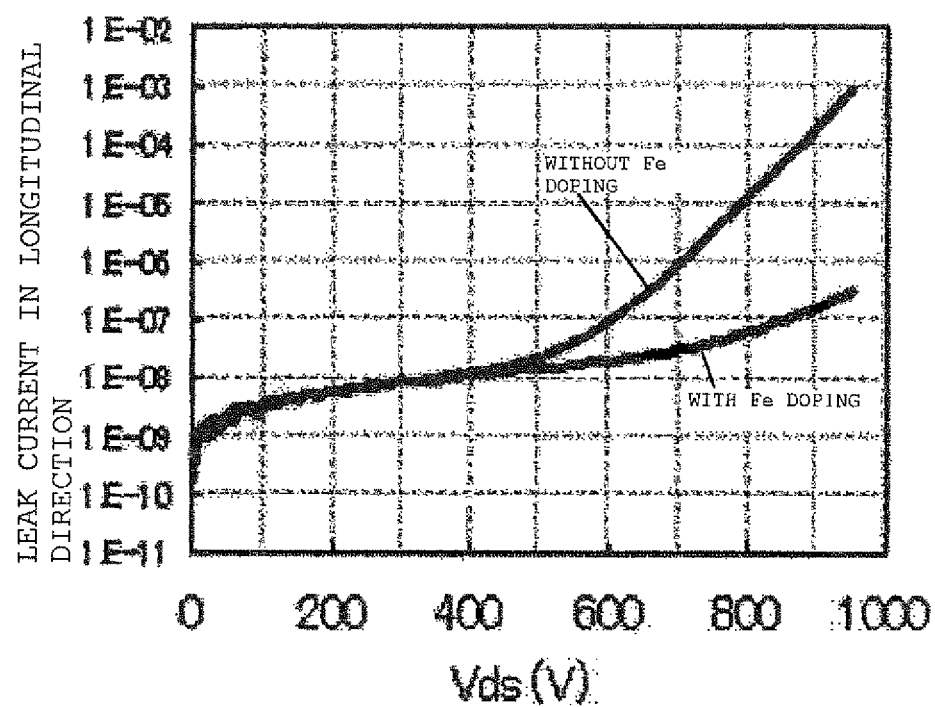
FIG. 12 is a view showing leak current characteristics in a longitudinal direction of a conventional semiconductor device.
Figure 13:
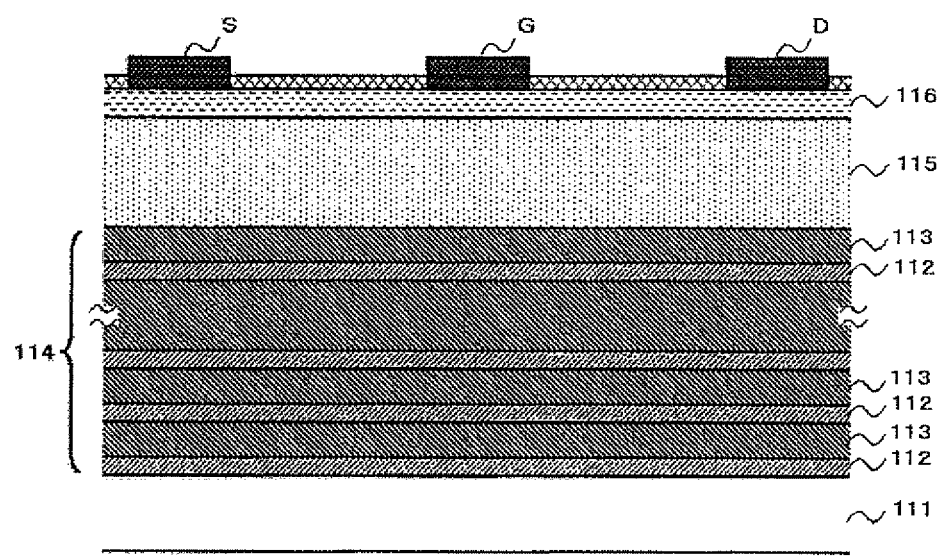
FIG. 13 is a cross-sectional view showing a conventional semiconductor substrate.

Moreover, the leak current characteristics of the fabricated semiconductor device at 150° C. (i.e., at the time of the high-temperature operation) were measured in the same manner as in FIG. 8. FIG. 11 shows this result.

As can be understood from FIGS. 6, 9, and 11, in the semiconductor device according to Example, at the time of the high-temperature operation, the leak current in the lateral direction was able to be reduced as compared with that of the semiconductor device according to Comparative Example 2 (the buffer layer was doped with a fixed amount of Fe), and the lateral direction leak current was able to be suppressed equivalently with that of the semiconductor device according to Comparative Example 1 (the buffer layer was not doped with Fe). Consequently, it can be understood that the semiconductor device according to Example is a semiconductor device which reduces the overall leak current and has a high breakdown voltage.

As can be understood from FIGS. 7, 8, and 10, in the semiconductor device according to Example, the leak current in the longitudinal direction could be reduced as compared with that of the semiconductor device according to Comparative Example 1 (the buffer layer was not doped with Fe), and the leak current in the longitudinal direction was increased as compared with that of the semiconductor device according to Comparative Example 2 (the buffer layer was doped with a fixed amount of Fe), but it was a level at which no problem occurred.

It is to be noted that the present invention is not restricted to the embodiment. The embodiment is an illustrative example, and any example which substantially has the same structure and exerts the same functions and effects as the technical concept described in claims of the present invention is included in the technical scope of the present invention.

The invention claimed is:

1. A substrate for semiconductor device comprising:
   a substrate;
   a buffer layer which is provided on the substrate and made of a nitride semiconductor;
   a device active layer which is provided on the buffer layer and composed of a nitride semiconductor layer, and
   a high-resistance layer between the buffer layer and the device active layer,
   wherein:
   the buffer layer contains carbon and iron,
   an iron concentration of the buffer layer decreases along a direction from the substrate toward the device active layer,
   an iron concentration of an upper surface of the buffer layer is lower than an iron concentration of a lower surface of the buffer layer, a carbon concentration of the buffer layer increases along the direction from the substrate toward the device active layer, a carbon concentration of the upper surface of the buffer layer is higher than a carbon concentration of the lower surface of the buffer layer, the lower surface of the buffer layer is located in a lower portion of the buffer layer on a substrate side of a position at which the iron concentration starts decreasing, the carbon concentration of the lower surface of the buffer layer is $1\times10^{17}$ atoms/cm$^3$ or more, and a maximum value of a carbon concentration of the high-resistance layer is equal to or higher than a maximum value of the carbon concentration of the buffer layer.

2. The substrate for semiconductor device according to claim 1, wherein a sum of the carbon concentration and the iron concentration of the upper surface of the buffer layer is not lower than a sum of the carbon concentration and the iron concentration of the lower surface of the buffer layer.

3. The substrate for semiconductor device according to claim 1, wherein the buffer layer is a stacked body of AlGaN layers having different compositions or a stacked body of an AlN layer and a GaN layer.

4. The substrate for semiconductor device according to claim 2, wherein the buffer layer is a stacked body of AlGaN layers having different compositions or a stacked body of an AlN layer and a GaN layer.

5. The substrate for semiconductor device according to claim 1, wherein the carbon concentration of the high-resistance layer is not lower than the carbon concentration of the buffer layer.

6. The substrate for semiconductor device according to claim 2, wherein the carbon concentration of the high-resistance layer is not lower than the carbon concentration of the buffer layer.

7. The substrate for semiconductor device according to claim 3, wherein the carbon concentration of the high-resistance layer is not lower than the carbon concentration of the buffer layer.

8. The substrate for semiconductor device according to claim 4, wherein the carbon concentration of the high-resistance layer is not lower than the carbon concentration of the buffer layer.

9. The substrate for semiconductor device according to claim 5, wherein the high-resistance layer is made of GaN having a thickness of 500 nm or more.

10. The substrate for semiconductor device according to claim 6, wherein the high-resistance layer is made of GaN having a thickness of 500 nm or more.

11. The substrate for semiconductor device according to claim 7, wherein the high-resistance layer is made of GaN having a thickness of 500 nm or more.

12. The substrate for semiconductor device according to claim 8, wherein the high-resistance layer is made of GaN having a thickness of 500 nm or more.

13. The substrate for semiconductor device according to claim 1, wherein the buffer layer is a stacked body of an AlN layer and a GaN layer, and each layer of the stacked body has a thickness of 0.5 nm or more and 300 nm or less.

14. The substrate for semiconductor device according to claim 2, wherein the buffer layer is a stacked body of an AlN layer and a GaN layer, and each layer of the stacked body has a thickness of 0.5 nm or more and 300 nm or less.

15. The substrate for semiconductor device according to claim 3, wherein the buffer layer is a stacked body of an AlN layer and a GaN layer, and each layer of the stacked body has a thickness of 0.5 nm or more and 300 nm or less.

16. A semiconductor device comprising the substrate for semiconductor device according to claim 1, wherein:
the device active layer further comprises:
a channel layer made of a nitride semiconductor; and
a barrier layer made of a nitride semiconductor having a different band gap from that of the channel layer, and
the semiconductor device further comprises an electrode which is electrically connected with a two-dimensional electron gas layer formed near an interface between the channel layer and the barrier layer.

17. A substrate for semiconductor device comprising:
a substrate;
a buffer layer which is provided on the substrate and made of a nitride semiconductor;
a device active layer which is provided on the buffer layer and made of a nitride semiconductor, and
a high-resistance layer between the buffer layer and the device active layer,
wherein:
the buffer layer includes a region where a carbon concentration increases and an iron concentration decreases along a direction from the substrate side toward the device active layer,
an iron concentration of an upper surface of the buffer layer is lower than an iron concentration of a lower surface of the buffer layer,
a carbon concentration of the upper surface of the buffer layer is higher than a carbon concentration of the lower surface of the buffer layer,
the lower surface of the buffer layer is located in a lower portion of the buffer layer on a substrate side of a position at which the iron concentration starts decreasing,
the carbon concentration of the lower surface of the buffer layer is $1\times10^{17}$ atoms/cm$^3$ or more, and
a maximum value of the carbon concentration of the high-resistance layer is equal to or higher than a maximum value of the carbon concentration of the buffer layer.

18. A semiconductor device comprising the substrate for semiconductor device according to claim 17, wherein:
the device active layer further comprises:
a channel layer made of a nitride semiconductor; and
a barrier layer made of a nitride semiconductor having a different band gap from that of the channel layer, and
the semiconductor device further comprises an electrode which is electrically connected with a two-dimensional electron gas layer formed near an interface between the channel layer and the barrier layer.

19. A method for manufacturing a semiconductor device, comprising:
forming a buffer layer made of a nitride semiconductor on a substrate;
forming a device active layer on the buffer layer;
forming a high-resistance layer between the buffer layer and the device active layer such that a maximum value of a carbon concentration of the high-resistance layer becomes equal to or higher than a maximum value of a carbon concentration of the buffer layer; and
forming an electrode on the device active layer,
wherein:
the buffer layer contains carbon and iron, and is formed such that:

(i) a carbon concentration of the buffer layer increases along a direction from the substrate toward the device active layer, (ii) a carbon concentration of an upper surface of the buffer layer becomes higher than a carbon concentration of a lower surface of the buffer layer, (iii) an iron concentration decreases along the direction from the substrate toward the device active layer, and (iv) an iron concentration of the upper surface of the buffer layer becomes lower than an iron concentration of the lower surface of the buffer layer, a lower surface of the buffer layer is formed before decreasing an iron doping amount along the direction from the substrate toward the device active layer, and the carbon concentration of the lower surface of the buffer layer is set to $1 \times 10^{17}$ atoms/cm$^3$ or more.

20. The method for manufacturing a semiconductor device according to claim 19, wherein forming the buffer layer includes forming a stacked body of AlGaN layers having different compositions or a stacked body of an AlN layer and a GaN layer.

\* \* \* \* \*